United States Patent [19]
Doyle

[11] Patent Number: 6,069,503
[45] Date of Patent: May 30, 2000

[54] HIGH VALUE FET RESISTORS ON A SUBMICRON MOS TECHNOLOGY

[75] Inventor: James T. Doyle, Chandler, Ariz.

[73] Assignee: Intel Corporation, Santa Clara, Calif.

[21] Appl. No.: 09/038,807

[22] Filed: Mar. 11, 1998

[51] Int. Cl.$^7$ .................................................. H03K 3/01
[52] U.S. Cl. ......................... 327/103; 327/308; 327/315; 330/81 R
[58] Field of Search .................................. 327/101, 103, 327/308, 315, 318, 324, 327, 389, 391, 403, 404, 581; 330/144, 145, 282; 333/81 R

[56] References Cited

U.S. PATENT DOCUMENTS

| | | | |
|---|---|---|---|
| 5,008,565 | 4/1991 | Taylor | 327/543 |
| 5,010,385 | 4/1991 | Shoemaker | 327/141 |
| 5,168,180 | 12/1992 | Bayer et al. | 327/535 |
| 5,210,503 | 5/1993 | Sawamura | 330/110 |
| 5,296,726 | 3/1994 | MacElwee | 257/213 |
| 5,744,994 | 4/1998 | Williams | 327/374 |
| 5,880,604 | 3/1999 | Kawahara | 327/544 |

*Primary Examiner*—Tuan T. Lam
*Attorney, Agent, or Firm*—Blakely, Sokoloff, Taylor & Zafman LLP

[57] ABSTRACT

A method and apparatus of biasing a transistor to perform as a resistive device in an integrated circuit die is disclosed. A base lead of a transistor is coupled to a first lead of the transistor. A voltage is applied to a first lead such that the voltage does not exceed a threshold voltage of the transistor.

23 Claims, 8 Drawing Sheets

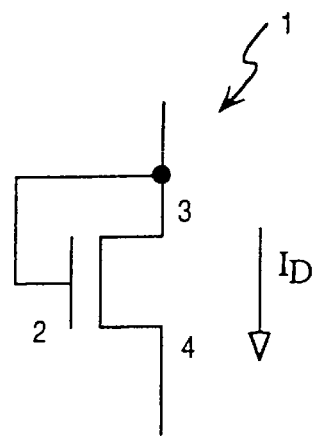
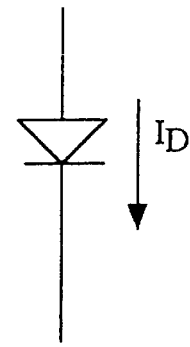
Fig. 2a  Fig. 2b
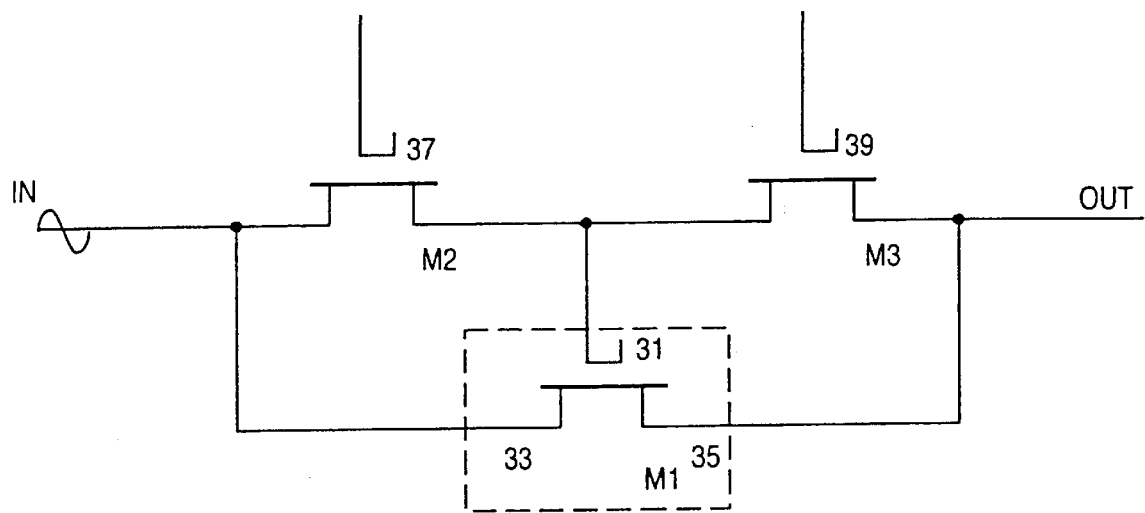
Fig. 3

HIGH VALUE FET RESISTORS ON A SUBMICRON MOS TECHNOLOGY

BACKGROUND OF THE INVENTION

(1) Field of the Invention

The invention generally relates to analog circuitry. More specifically, the invention relates to a resistive device for an implemented circuit using MOS materials.

(2) Prior Art

As integrated circuits become highly miniaturized, more and more circuitry is being designed on commercially important submicron metal-oxide semiconductor (herein MOS) materials. Typically, active devices such as transistors, and passive devices such as resistors are designed on a silicon die. The resistance value of such a resistor typically depends on the resistivity of the silicon. However, as increased signal processing capability is demanded from the die, the resistivity of the silicon is decreased by increasing the doping level of the silicon. Consequently, designing a passive resistor in a die becomes impracticable because of the large silicon area consumed by the resistor to compensate for the reduced resistivity of the die. Further where the resistance values reach Megaohms, it is also impractical to use a passive resistor. Such impracticabilities often require providing resistors external to the die.

However, external resistors are disadvantageous because the resistors are subject to environmental conditions. For example, humidity could cause external resistors to deteriorate to a lesser value. Further, the board on which the die and the resistors are connected ages with time resulting in leakage paths being formed which usually causes the die to malfunction. Another disadvantage is that external resistors are rather large, thereby hindering the miniaturization of the designed integrated circuit. Furthermore, additional manufacturing steps are required to add the external resistors to the board resulting in increased manufacturing costs and quality control problems.

One method of overcoming this problem is to use active resistors, i.e., resistors made of devices such as transistors which are fabricated in the die. Such resistive devices are smaller and more economical to produce than external resistors. Further high value resistance values in Megaohms can be realized in the die. Moreover, since the die containing the resistive devices is typically encapsulated with an insulating material, the resistive devices are not exposed to the erosive effects of the surrounding environment.

One such active resistor, for example, is implemented using a field-effect transistor (FET). However, FETs built on submicron MOS materials and operating in the linear region, the linear region to be discussed later, have an operating range that is too narrow for most analog input signals that could reach up to 2 volts peak to peak. This range is further narrowed in the subthreshold region, to be discussed later, which is a desirable operating region in low power analog circuits. Accordingly, what is needed is a method and apparatus to take advantage of a transistor's ability to function as a resistor while extending the transistor's operating range to cover the full operation range of analog input signal.

SUMMARY

The present invention provides a method and apparatus of biasing a transistor to perform as a resistive device in an integrated circuit die. A base lead of a transistor is coupled to a first lead of the transistor. A voltage is applied to a first lead such that the voltage does not exceed a threshold voltage of the transistor.

BRIEF DESCRIPTION OF THE DRAWINGS

The features, aspects, and advantages of the present invention will become more fully apparent from the following Detailed Description, appended claims, and accompanying drawings in which:

FIG. 2a illustrates an embodiment of the invention as a MOSFET configured to function as a resistive device and FIG. 2b illustrates an equivalent circuit thereof;

FIG. 3 is an embodiment of the invention as a resistive device configured to be bi-directional;

DETAILED DESCRIPTION OF THE INVENTION

In the following description, more specific details and examples have been set forth to provide a thorough understanding of the present invention. However, the specific details and examples do not limit the boundaries of the present invention, and one having ordinary skill in the art will recognize that the invention can be practiced without these specific details and examples. Furthermore, only circuitry necessary for a thorough understanding of the invention has been illustrated and described.

Field-effect transistors (FETS) are typically used in submicron MOS materials. FET is a type of transistor that operates by controlling the flow of current through the transistor with an electric field. While there are many known types of FETS, MOSFET has been chosen to illustrate the invention. However, it will be understood by one skilled in the art from reading the description, that the invention is not limited to MOSFETs, but may be practiced with other FETs and even other transistors or a combination of transistors that provide an equivalent function.

Figure 1:
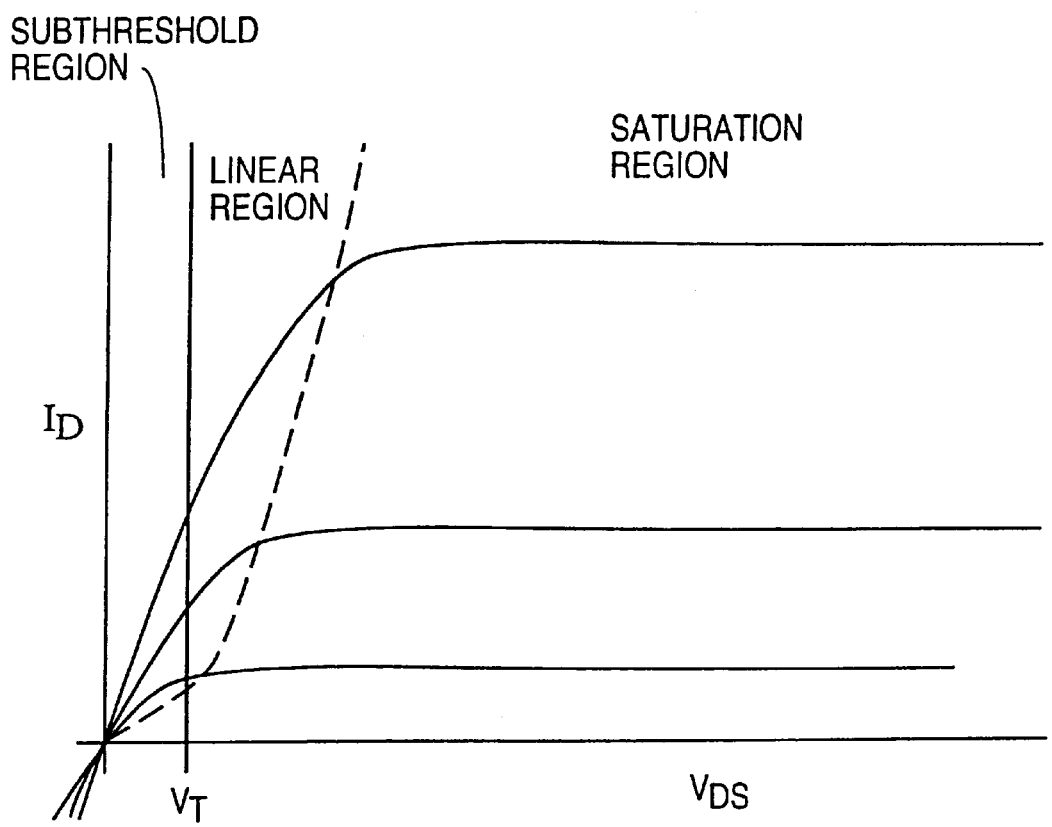
FIG. 1 illustrates three modes of operation of a metaloxide semiconductor field-effect transistor (MOSFET)

FIG. 1 illustrates a MOSFET region of operation. Specifically, a relationship between drain current (herein $I_D$) versus drain source voltage (herein $V_{DS}$) with respect to various gate source voltage (herein $V_{GS}$) is illustrated. AS shown in the figure, the graph can be divided into three areas of operation: first, a sub-threshold region; second, a linear region; and third, a saturation region. The saturation region is the area where the voltage $V_{DS}$ has reached values such that the MOSFET behaves like a constant current device. In this instance, the current $I_D$ levels to approach a constant value and are not significantly affected by further increases in voltage $V_{DS}$.

In the linear region, current $I_D$ increases proportionally with voltage VDS such that the MOSFET behaves like an ohmic resistive device. The value of drain to source resistance can be controlled by bias voltage VGS. However, the range of bias voltage $V_{GS}$ is normally limited by the drain supply voltage $V_{DD}$. Here the relationship between current $I_D$ and voltage $V_{GS}$ is square law, thus the term "linear region" is a misnomer. The linear region operates above the threshold voltage VT defined as the voltage VGS at which the current ID begins to flow by drift. This current is normally above 1 microamp. In this region, resistance values of up to 1 Megaohms are readily available. However, higher resistance values are obtainable by operating the MOSFET in the sub-threshold region. Furthermore, operation of MOSFET in the sub-threshold region below voltage VT is important when designing low power analog circuits.

The sub-threshold region is the region below voltage VT in which the MOSFET operates based on weak inversion. In this region current ID has an exponential relationship with voltage (VGS minus VT), thus is approximately linear. In theory, no current ID should flow through the MOSFET when voltage VGS is at or below voltage VT. However, in practice, some current does flow due to a small population of thermally energetic electrons. This flow of current is known as the diffusion current. This current is normally below 1 microamp which is characteristic of sub-threshold region. By biasing voltage VGS such that the MOSFET is operating in the sub-threshold region, resistance values of Megaohms or hundreds of Megaohms can be obtained. For low voltage operation, a controlled "backgating" using bodyeffect to increase threshold voltage VT can further adjust the resistance of the FET. Backgating is a result of substrate bias relative to the source and/or drain depending on the application which causes the threshold voltage VT to increase which in turn can alter the resistance of the FET. However, care must be taken as not to increase the voltage VT to the extreme such that the resistance peaking effect causes the channel of the FET to be non-conductive and thus, non-operational. Additionally, altering threshold voltage VT as alters the turn on voltage of MOSFET which can allow the MOSFET to switch on faster or slower depending on the desired result. In this instance, such alteration is relevant to producing faster switching MOSFETs.

FIG. 2a illustrates an embodiment of a MOSFET configured to function as a resistive device. As illustrated, gate 2 and drain 3 of the MOSFET are connected together. In this configuration. The MOSFET behaves like a diode with the turn on voltage at VT. To function as an ohmic resistive device, voltage VGS should not exceed the voltage VT thereby operating in the subthreshold region. This resistive device is suitable for low power analog circuits based on weak inversion operation of the MOSFET. Further, the MOSFET as configured is biased by the received signal at the input of the MOSFET. Assuming that the MOSFET has a voltage VT value of 600 millivolts, the operating range of the MOSFET in the sub-threshold region would be up to 600 millivolts. In other words, the resistive device 1 operating in the sub-threshold region could channel signals of 600 millivolts peak to peak between lead 3 and lead 4 of the MOSFET. However, in analog circuit design, signals up to 2 volts peak to peak are encountered. Therefore, for such signals greater than 600 millivolts, the resistive device would operate as a normal diode which is unsuitable as resistive device.

Referring to FIG. 2b, the configuration of the resistive device shown in FIG. 2a could be analogized as a diode as described in FIG. 2b. The resistive device acts as a rectifier allowing small signals to travel in one direction only. This particular configuration is also suitable for use with direct current (DC) signals. However, if the resistive device is made bi-directional, the resistive device will not only channel signals of either polarity but also allow voltage VT to extend in either direction through zero. Consequently, by making the resistive device bi-directional, the resistive device could channel signals of 2VT or 1.2 volts peak to peak.

FIG. 3 is an embodiment of the invention as a resistive device configured to be bi-directional. MOSFET M1 is the active resistor. MOSFETs M2 and M3 are switches that allow the MOSFET M1 to be bi-directional. Although switches M2 and M3 are shown here to be MOSFETs, one skilled in the art would recognize that the switches are not limited to MOSFETs and other devices may be used as switches.

When an input signal is applied as shown, if the signal is positive at the input, a switch signal is applied to gate 37 of MOSFET M2. This causes MOSFET M2 to be switched on connecting gate 31 and lead 33 of MOSFET M1 to the input. The configuration of gate 31 and lead 33 connected to the input allows MOSFET M1 to operate as a diode channeling the positive input signal from lead 33 to lead 35. Meanwhile, MOSFET M3 is switched off.

Similarly, when the input signal is negative at the input, a switch signal is applied to gate 39 of MOSFET M3. MOSFET M3 is switched on connecting gate 31 and lead 35 of MOSFET M1 to the output. The configuration of gate 31 and lead 35 connected to the output allow MOSFET M1 to function as a diode channeling the negative input signal from lead 33 to lead 35. By switching the MOSFETS M2 and M3 according to the polarity of the input signal, the active resistor MOSFET M1 functions as a floating resistor that turns with the alternating current signal.

Figure 4A:
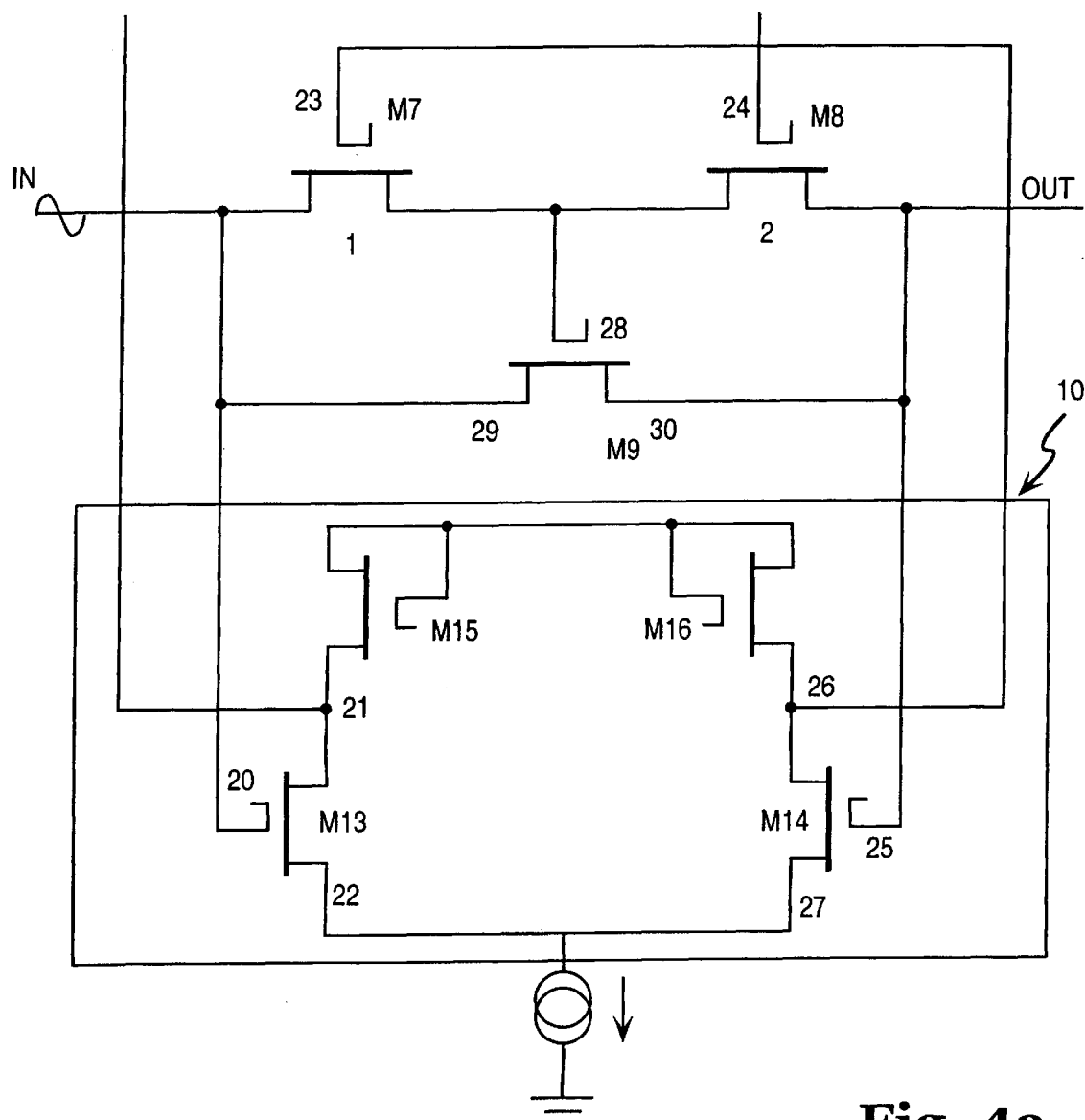
FIG. 4a illustrates an embodiment of the invention providing bias signals to MOSFET switches.

FIG. 4a illustrates an exemplary embodiment that provides the switch signals to the gates of MOSFET switches M7 and M8. However, one skilled in the art would recognize that other circuitry may be used to perform the equivalent function of switching on and off switches M7 and M8. Block 10 is a comparator. A simplified comparator is illustrated here to provide an understanding of the invention and by no means limit the invention. One skilled in the art would understand that various forms of comparators may be used to allow active resistor MOSFET M9 to be bi-directional. Here, the comparator comprises MOSFETs M13, M14, M15, and M16. MOSFETs M13 and M14 are comparing MOSFETS. MOSFET M15 is a resistive load for MOSFET M13, and MOSFET M16 is a resistive load for MOSFET M14. The following illustrates how the comparator 10 operates.

When the signal at the input is positive, this causes a positive bias on gate 20, causing MOSFET M13 to conduct. This lowers the voltage at output 21 of MOSFET M13. Output 21 of MOSFET M13 is connected to the gate 24 of MOSFET switch M8. Since the voltage at output 21 of MOSFET M13 is low, the voltage at gate 24 of MOSFET switch M8 is also low, causing MOSFET switch M8 to be switched off. Since MOSFET M8 is switched off, the voltage at gate 25 of MOSFET M14 is low causing MOSFET M14 to be switched off causing the voltage at output 26 of MOSFET M14 to be high. This causes the voltage at gate 23 of MOSFET switch M7 to be high which in turn causes MOSFET switch M7 to be switched on. The MOSFET switch M7 switching on causes the gate 28 and lead 29 of active resistor MOSFET M9 to be connected together and allowing the positive signal to flow from input to output.

When the signal at the input is negative, this causes a negative bias on gate 20 which in turn switches off MOSFET M13 causing the voltage at output 21 of MOSFET M13 to be high. Since the voltage at output 21 of MOSFET M13 is high, the gate of MOSFET M8 is also biased high, causing the MOSFET M8 to be switched on. When MOSFET M8 is switched on, this causes voltage at gate 25 of MOSFET M14 to be high which causes the MOSFET M14 to be switched on. This causes the voltage at output 26 of MOSFET M14 to be low which in turn causes the bias at gate 23 of MOSFET M7 to be low. Since the bias at gate 23 of MOSFET M7 is low, the MOSFET M7 is switched off. The MOSFET switch M8 switching on causes the gate 28 and lead 30 of active resistor M9 to be connected together and allowing the negative signal to flow from input to output.

Figure 4B:
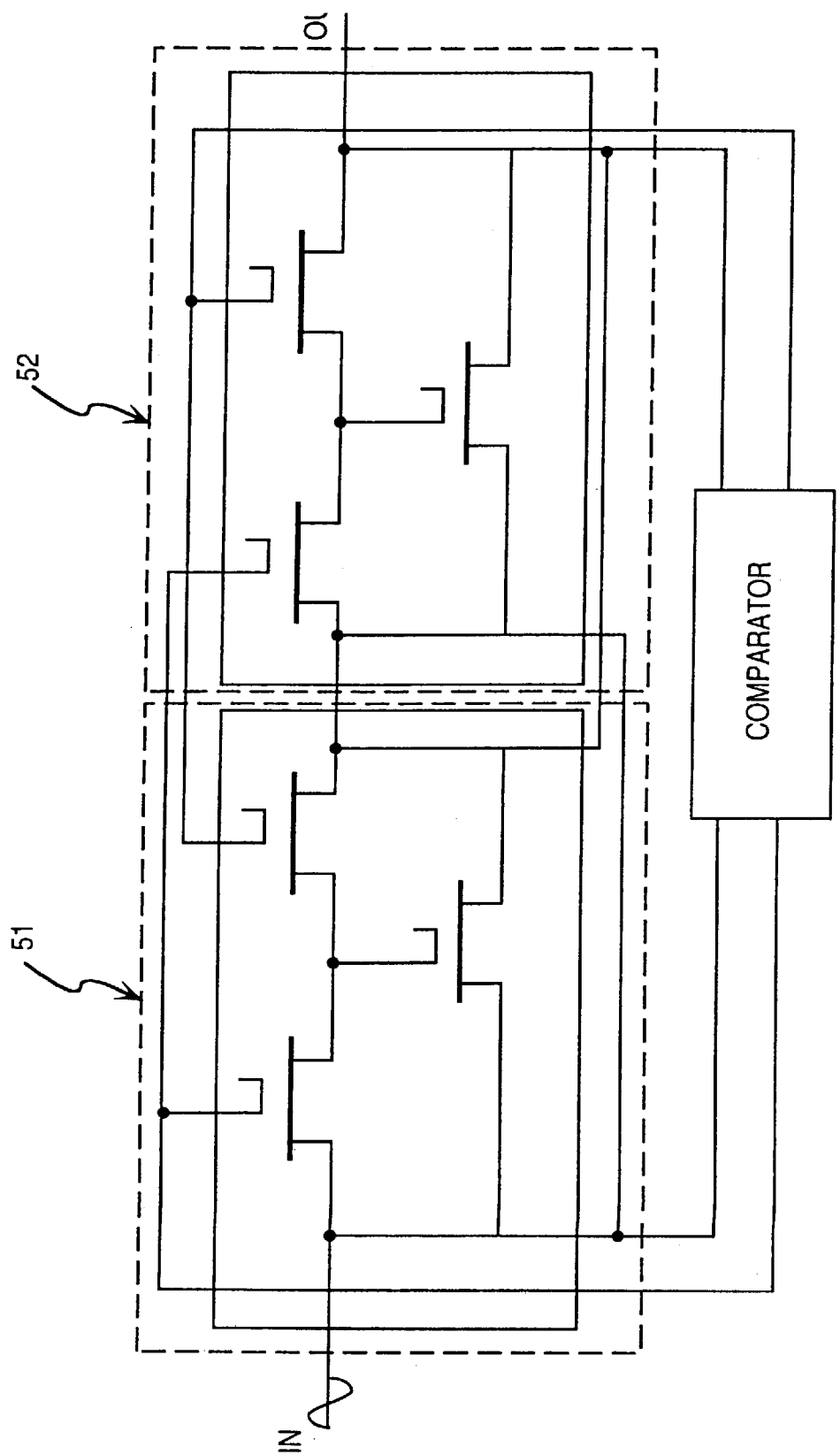
FIG. 4b illustrates two resistive devices coupled in series according to another embodiment.

The embodiment described above allows the active resistor MOSFET M9 to operate bi-directionally in the range of 1.2 volts peak-to-peak assuming the active resistor MOSFET M9 has a voltage $V_T$ value of 600 millivolts. However, as mentioned previously, small signals of analog circuitry typically have an operating range of up to 2 volts peak-to-peak. Thus, one resistive device may not cover the total operating range of that signal. Accordingly, referring to FIG. 4b, the operating range of one resistive device 51 could be extended to two $V_T$ in either direction or 2.4 volts peak to peak by coupling the resistive device 51 with another resistive device 52.

Figure 5:
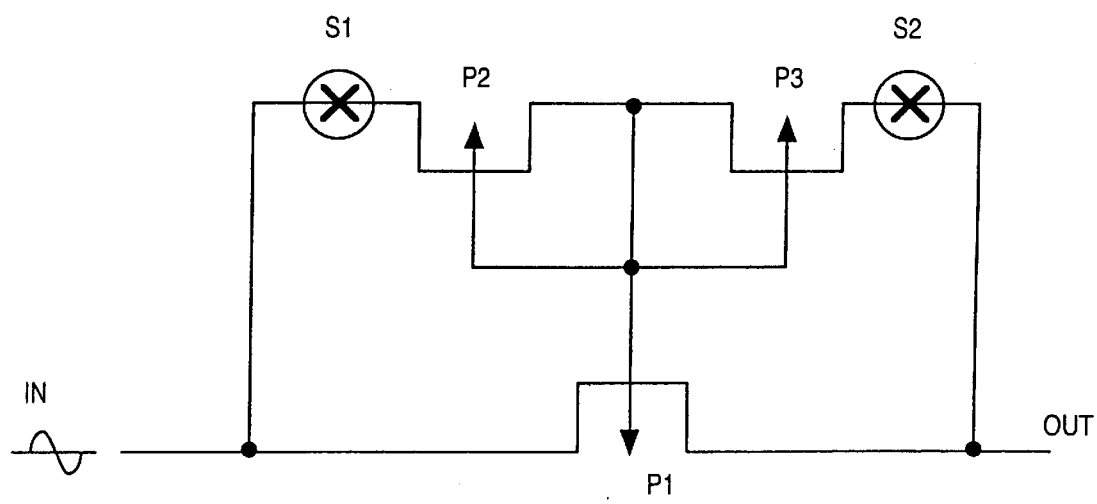
FIG. 5 illustrates another embodiment of the invention as a resistive device configured to be bi-directional.

FIG. 5 illustrates another exemplary embodiment to configure a MOSFET to function as a bi-directional resistive device and further provides a very high value FET resistance. In this embodiment, the PMOS devices have been chosen for illustration. However, one skilled in the art will recognize that other active devices can be used. MOSFET P1 is the active resistor. MOSFETs P2 and P3, in conjunction with P1, form current mirrors. Current mirror is based on the principle that, if the gate-source potential of two identical MOSFETs are equal, the channel currents should be equal. However, by altering the width and/or length of the channel of a MOSFET, the resistance can be changed, altering the drain current of the MOSFET. As an example, if the width of MOSFETs P2 and/or P3 is ten times that of the width of MOSFET P1, a 10 microamp drain current flowing in MOSFET P2 and/or P3 will result in a flow of 1 microamp drain current flowing in MOSFET P1. Stated differently, between MOSFET P2 and/or P3 and MOSFET P1, the resistance has increased by 10-fold. Further, by biasing MOSFET P1 and about 1 microamp, MOSFET P1 is operating in the sub-threshold region. Switches S1 and S2 switch on and off depending on the polarity of the input signal.

As an example, at positive polarity, switch S1 would switch on and switch S2 would switch off, connecting MOSFETs P1 and P2 to form the current mirror. At negative polarity, switch S1 would switch off and switch S2 would switch on, connecting MOSFET P1 and P3 to form the current mirror. The switches S1 and S2 may be, but not limited to, MOSFETs with a comparator providing the switching signals.

Figure 6A:
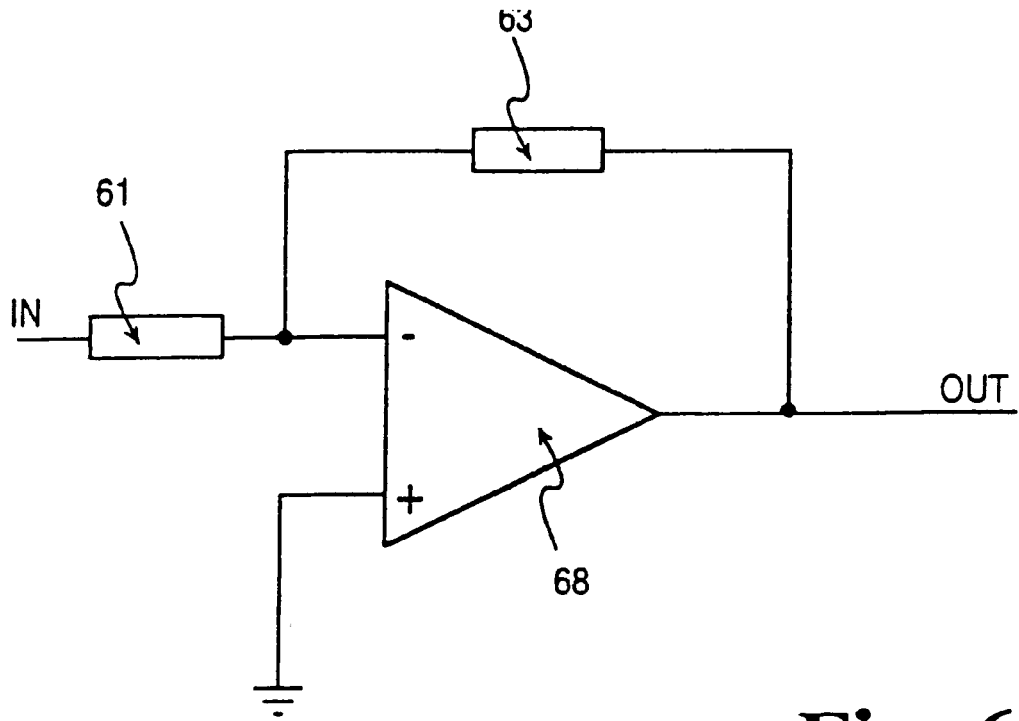
FIGS. 6a and 6b illustrate an application of the resistive devices according to the invention.
Figure 6B:
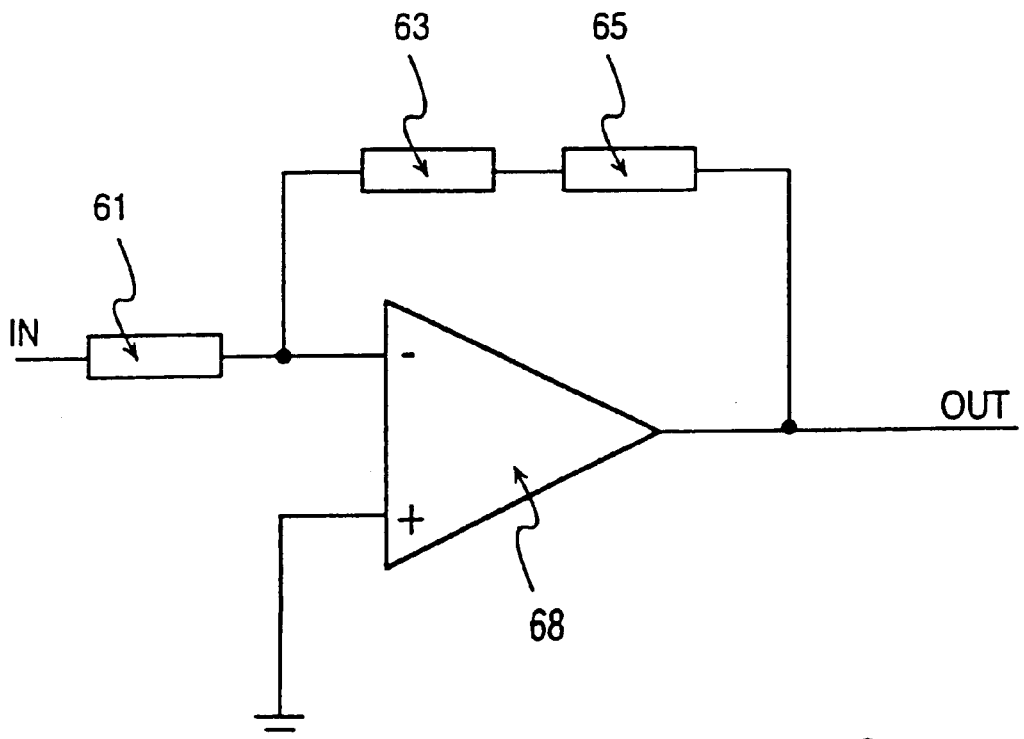

FIG. 6a illustrates another embodiment of the invention that uses the bi-directional resistive devices as described above. In this instance, resistive devices 61, 63 are inserted in a circuit such as, by way of example, an inverting amplifier that features an operational amplifier 68. As described above, the relationship between current $I_D$ and voltage $V_{GS}$ for each device is exponential and although non-linear, is approximately linear. Significantly, in a circuit such as the inverting amplifier of FIG. 6a whose operation depends on a ratio of two resistors, the non-linear characteristics of one of the two devices 61 and 63 "tracks" the others, resulting in effective cancellation of the non-linearity. Stated differently, matched non-linear resistive elements in a feedback configuration produce linear gain. The output signal is thus proportionally linear with respect to the input signal even though the two resistive devices 61, 63 used are non-linear, because the gain of the amplifier is dependent on the ratio of the resistance values of the two devices. Actual gain can be obtained by adding additional resistive devices to the feedback path containing device 63. For example, to produce a gain of 2, a resistive device 65 is added to resistive device 63 as illustrated in FIG. 6b. The ratioed resistive device, however, are not limited to circuitry using operational amplifiers, but can be utilized in all circuits that need a ratio of resistors to perform an operation, including phase locked loops, oscillators, bandgap circuits, and A/D or D/A converters.

Figure 7:
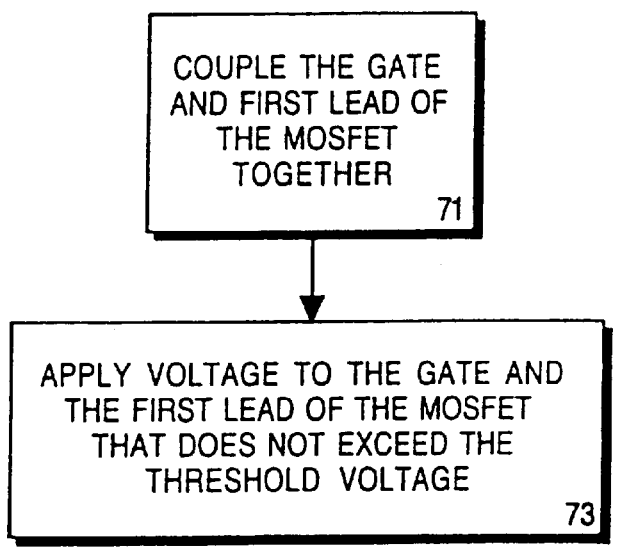
FIG. 7 illustrates a method of biasing a transistor in the sub-threshold region according to the invention.

FIG. 7 illustrates a method of biasing a transistor in a sub-threshold region. At block 71, the gate of the MOSFET is coupled to the source of the MOSFET. At block 73, a signal is applied to the source such that voltage $V_{DS}$ and voltage $V_{GS}$ do not exceed the threshold voltage $V_T$. The MOSFET is thus operating within the sub-threshold region as described above with reference to FIG. 2a. Further, the MOSFET is a non-limiting example and other transistors may be used.

Figure 8:
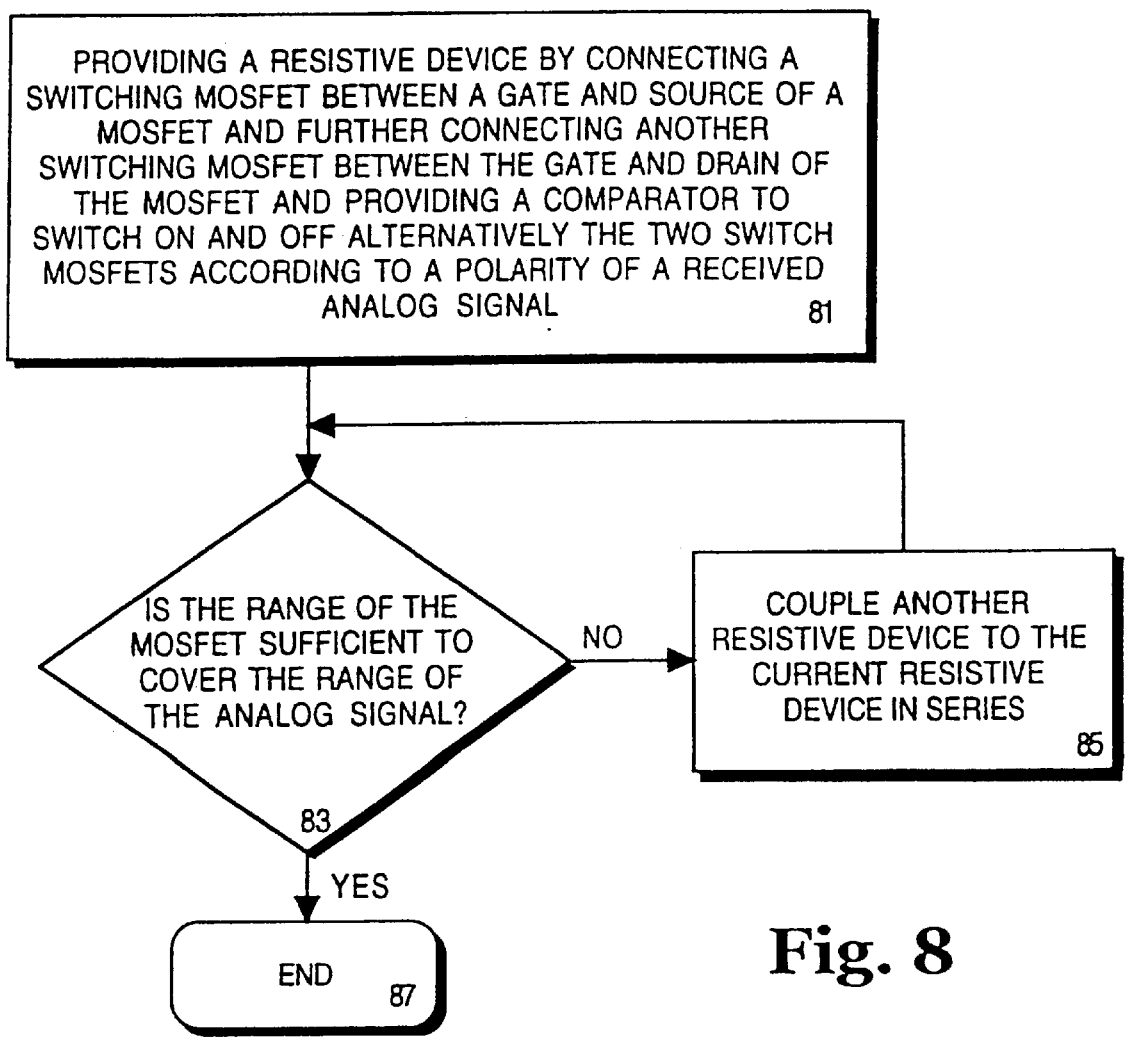
FIG. 8 illustrates a method of using resistive devices in an integrated circuit die according to the invention.

FIG. 8 illustrates a method of making and using a resistive device in an integrated circuit die. Block 81 illustrates an exemplary method of making a bi-directional resistive device. At block 83, the sufficiency of the range of the resistive device is determined. If the resistive device has insufficient range to cover the range of the analog signal to be received at block 85, another resistive device is coupled in series to increase the range, as described above with reference to FIG. 5.

Figure 9:
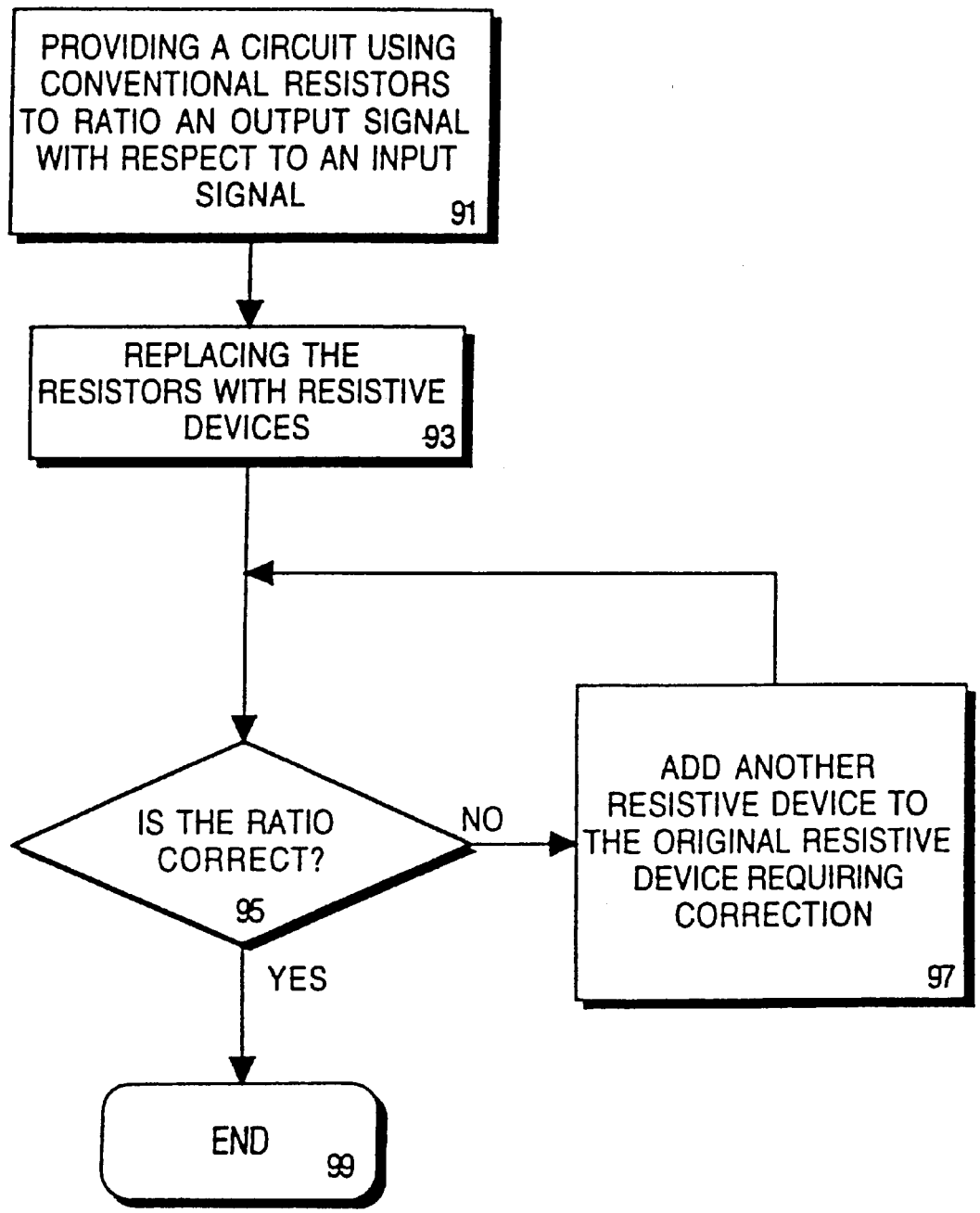
FIG. 9 illustrates another method of using resistive devices in a circuitry according to the invention.

FIG. 9, specifically blocks 91–99, illustrates a method of using resistive devices in a circuitry using resistors to ratio an output signal with an input signal.

It will however be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. A method of using a transistor as a resistive device comprising:

a. coupling a first control lead of a first transistor with a first lead of said first transistor; and b. applying a differential voltage between said first control lead and a second lead that does not exceed a threshold voltage of said first transistor such that said first transistor performs as said resistive device;

c. coupling a first switch between said first control lead and said first lead of said first transistor;

d. coupling a second switch between said first control lead and a second lead of said first transistor; and e. coupling a control circuit with said first switch and said second switch to switch said first and said second switches on and off alternatively according to a polarity of a voltage at said first lead of said first transistor.

2. The method according to claim 1, further comprising:

a. coupling a second control lead and a third lead of a second transistor to said first control lead of said first transistor such that said first and said second transistors forming a current mirror;

b. coupling a fourth lead of said second transistor with said first switch;

c. coupling a third control lead and a fifth lead of a third transistor to said first control lead of said first transistor such that said first and said third transistors forming a current mirror;

d. coupling a sixth lead of said third transistor with said second switch wherein said control circuit switching said first and second switches on and off alternatively causing said second and third transistors to switch on and off alternatively according to a polarity of said voltage.

3. An apparatus comprising:

a first transistor device having a first control lead, a first lead and a second lead, wherein a differential voltage between said first control lead and one of said first lead and said second lead does not exceed the threshold voltage of said first transistor, a first switch coupled with said first control lead and said first lead of said first transistor;

a second switch coupled with said first control lead and said second lead of said first transistor; and a control circuit coupled with said first switch and said second switch to switch said first and second switches on and off alternatively according to a polarity of a signal that propagates through the first transistor.

4. The apparatus of claim 3, further comprising:

a second transistor having a second control lead, a third lead and a fourth lead, said second control lead and said third lead coupled to said first control lead of said first transistor to form a current mirror, said fourth lead coupled to said first switch; and a third transistor having a third control lead, a fifth lead and a sixth lead, said third control lead and said fifth lead coupled to said first control lead of said first transistor to form a current mirror, said sixth lead coupled to said second switch.

5. The apparatus of claim 4, wherein said first transistor, second transistor and third transistor are MOSFETs.

6. The apparatus of claim 3, wherein said first and second switches are MOSFETS.

7. The apparatus of claim 3, wherein said control circuit is a comparator comprising:

a first sensing device to switch said second switch on and off according to a sensed polarity of said signal and having a first input and a first output and said first input receiving said signal, said first output coupled with said second switch;

a second sensing device to switch said first switch on and off in a manner complementary to said first output of said first sensing device and having a second input and a second output and said second output coupled with said first switch, said second input responding to said first output of said first sensing device.

8. An apparatus comprising:

circuitry means having a plurality of resistive devices wherein each of said resistive devices includes, a first transistor having a first control lead, a first lead and a second lead;

a first switch coupled with said first control lead and said first lead of said first transistor;

a second switch coupled with said first control lead and said second lead of said first transistor; and a control circuit coupled with said first switch and said second switch to switch said first and second switches on and off alternatively according to a polarity of a signal that propagates through the first transistor.

9. The apparatus of claim 8, further comprising:

a second transistor having a second control lead, a third lead and a fourth lead, said second control lead and said third lead coupled to said first control lead of said first transistor to form a current mirror, said fourth lead coupled to said first switch; and a third transistor having a third control lead, a fifth lead and a sixth lead, said third control lead and said fifth lead coupled to said first control lead of said first transistor to form a current mirror, said sixth lead coupled to said second switch.

10. The apparatus of claim 9, wherein said first transistor, second transistor and third transistor are MOSFETs.

11. The apparatus of claim 8, wherein said first and second switches are MOSFETS.

12. The apparatus of claim 8, wherein said control circuit is a comparator comprising:

a first sensing device to switch said second switch on and off according to a sensed polarity of said signal and having a first input and a first output and said first input receiving said signal, said first output coupled with said second switch;

a second sensing device to switch said first switch on and off in a manner complementary to said first output of said first sensing device and having a second input and a second output and said second output coupled with said second first, said second input responding to said first output of said first sensing device.

13. The apparatus of claim 8, wherein said circuitry means comprises:

an operational amplifier having an output and an input;

one of said resistive devices having one end coupled to said output of said operational amplifier and having another end coupled to said input of said operational amplifier;

another of said resistive devices having one end coupled to said input of said operational amplifier and having an other end for receiving said signal.

14. A method of providing a resistive device comprising:

a. coupling a first control lead and a first lead of a first transistor with a first switch;

b. coupling said first control lead and a second lead of said first transistor to a second switch;

c. coupling a control circuit with said first switch and said second switch to switch said first and second switches on and off alternatively according to a polarity of a signal that propagates through the first transistor;

d. coupling a second control lead and a third lead of a second transistor to said first control lead of said first transistor such that said first and said second transistor forming a current mirror;

e. coupling a fourth lead of a second transistor with said first switch;

f. coupling a third control lead and a fifth lead of a third transistor to said first control lead of said first transistor such that said first and said third transistor forming a current mirror; and g. coupling a sixth lead of said third transistor with said second switch wherein said control circuit switching said first and second switches on and off alternatively causing said second and third transistors to switch on and off alternatively according to a polarity of said signal.

15. The method according to claim 14, wherein said first transistor, second transistor and third transistor are MOSFETs.

16. The method according to claim 14, wherein said first and second switches are MOSFETS.

17. The method of claim 14, wherein said control circuit is a comparator comprising:
   a first sensing device to switch said second switch on and off according to the sensed polarity of said signal and having a first input and a first output and said first input receiving said signal, said first output coupled with said second switch;
   a second sensing device to switch said first switch on and off in a manner complementary to said first output of said first sensing device and having a second input and a second output and said second output coupled with said first switch, said second input responding to said first output of said first sensing device.

18. A method of using a resistive device comprising:
   a. coupling a plurality of resistive devices in a circuit wherein said circuit uses said resistive devices to ratio an output signal to an input signal, each of said resistive devices provided by;
      a1. coupling a first control lead and a first lead of a first transistor to a first switch;
      a2. coupling said first control lead and a second lead of said first transistor to a second switch;
      a3. coupling a control circuit with said first switch and said second switch to switch said first and second switches on and off alternatively according to a polarity of a signal that propagates through the first transistor.

19. The method according to claim 18, further comprising:
   a. coupling a second control lead and a third lead of a second transistor to said first control lead of said first transistor such that said first and said second transistor forming a current mirror;
   b. coupling a fourth lead of a second transistor with said first switch;
   c. coupling a third control lead and a fifth lead of a third transistor to said first control lead of said first transistor such that said first and said third transistor forming a current mirror;
   d. coupling a sixth lead of said third transistor with said second switch wherein said control circuit switching said first and second switches on and off alternatively causing said second and third transistors to switch on and off alternatively according to a polarity of said voltage.

20. The method according to claim 19, wherein said first transistor, second transistor and third transistor are MOSFETs.

21. The method according to claim 18, wherein said first and second switches are MOSFETs.

22. The method according to claim 18, wherein said control circuit is a comparator comprising:
   a first sensing device to switch said second switch on and off according to a sensed polarity of said signal and having a first input and a first output and said first input receiving said signal, said first output coupled with said second switch;
   a second sensing device to switch said first switch on and off in a manner complementary to said first output of said first sensing device and having a second input and a second output and said second output coupled with said first switch, said second input responding to said first output of said first sensing device.

23. The method according to claim 18, wherein said circuit comprises:
   an operational amplifier having an output and an input;
   one of said resistive devices having one end coupled to said output of said operational amplifier and having another end coupled to said input of said operational amplifier; and
   another of said resistive devices having one end coupled to said input of said operational amplifier and having an other end for receiving said signal.

* * * * *

UNITED STATES PATENT AND TRADEMARK OFFICE
CERTIFICATE OF CORRECTION

PATENT NO. : 6,069,503
DATED : May 30, 2000
INVENTOR(S) : Doyle

It is certified that error appears in the above-identified patent and that said Letters Patent is hereby corrected as shown below:

Column 1,
Line 61, delete "range of analog" and insert -- range of the analog --.

Column 2,
Line 11, delete "metaloxide" and insert -- metal oxide --.
Lines 59-60, delete "AS shown" and insert -- As shown --.

Column 4,
Line 48, delete "MOSFETS" and insert -- MOSFETs --.

Signed and Sealed this

Eighteenth Day of February, 2003

JAMES E. ROGAN
*Director of the United States Patent and Trademark Office*